United States Patent
Nakano et al.

(10) Patent No.: US 7,984,390 B2
(45) Date of Patent: Jul. 19, 2011

(54) DATA PROCESSING METHOD IN SEMICONDUCTOR DEVICE, PROGRAM OF THE SAME, AND MANUFACTURING METHOD OF SEMICONDUCTOR DEVICE

(75) Inventors: Ayako Nakano, Yokohama (JP); Toshiya Kotani, Machida (JP); Atsushi Watanabe, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 11/492,802

(22) Filed: Jul. 26, 2006

(65) Prior Publication Data

US 2007/0028205 A1 Feb. 1, 2007

(30) Foreign Application Priority Data

Jul. 27, 2005 (JP) ................... 2005-217689

(51) Int. Cl.
*G06F 17/50* (2006.01)
(52) U.S. Cl. ........................... 716/50; 716/53
(58) Field of Classification Search ............... 716/19, 716/21, 50–53; 430/5, 22, 30
See application file for complete search history.

(56) References Cited

U.S. PATENT DOCUMENTS

| | | | |
|---|---|---|---|
| 6,128,767 A * | 10/2000 | Chapman | 716/1 |
| 6,249,900 B1 | 6/2001 | Kotani et al. | |
| 6,507,931 B2 | 1/2003 | Kotani et al. | |
| 6,763,508 B2 * | 7/2004 | Igarashi et al. | 716/8 |
| 6,779,167 B2 * | 8/2004 | Igarashi et al. | 716/13 |
| 7,127,694 B2 * | 10/2006 | Watanabe et al. | 716/9 |
| 7,174,529 B1 * | 2/2007 | Hetzel | 716/13 |
| 7,266,801 B2 * | 9/2007 | Kotani et al. | 716/21 |
| 7,389,483 B2 * | 6/2008 | Kang | 716/9 |
| 2005/0025351 A1 | 2/2005 | Kotani et al. | |

FOREIGN PATENT DOCUMENTS

| | | |
|---|---|---|
| JP | 7-120932 | 5/1995 |
| JP | 10-334126 | 12/1998 |
| JP | 11-126824 | 5/1999 |
| JP | 2000-243941 | 9/2000 |
| JP | 2001-13668 | 1/2001 |
| JP | 2002-329783 | 11/2002 |
| JP | 2006-173186 | 6/2006 |

OTHER PUBLICATIONS

Notification of Reasons for Rejection mailed by Japanese Patent Office on Dec. 7, 2010, in Japanese patent application No. 2005-217689.

* cited by examiner

*Primary Examiner* — Jack Chiang
*Assistant Examiner* — Binh C Tat
(74) *Attorney, Agent, or Firm* — Finnegan, Henderson, Farabow, Garrett & Dunner, L.L.P.

(57) ABSTRACT

A design data processing method in a semiconductor device includes extracting, from design data, a graphic in which there exist a first wiring and a second wiring which is orthogonal to the first wiring, and changing a portion where the first wiring is orthogonal to the second wiring to make connection at an angle other than 90 degrees, thereby preparing new design data.

16 Claims, 9 Drawing Sheets

DATA PROCESSING METHOD IN SEMICONDUCTOR DEVICE, PROGRAM OF THE SAME, AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2005-217689, filed Jul. 27, 2005, the entire contents of which are incorporated herein by reference.

BACKGROUND OF THE INVENTION

1. Field of the Invention

The present invention relates to a design data processing method in a semiconductor device, more particularly to a design data processing method capable of shortening OPC processing time and increasing a process margin, a program of the method, and a manufacturing method of a semiconductor device by use of a mask made in accordance with the processing method.

2. Description of the Related Art

In recent years, a semiconductor manufacturing technology has advanced remarkably, and a semiconductor device having a minimum working size of 0.09 μm is manufactured. Such miniaturization is realized by the rapid progress of micropattern forming technologies such as a mask process technology, photolithography technology and etching technology.

When a pattern size is sufficiently large, as a design pattern, a plane shape of an LSI pattern to be formed on a wafer is drawn as it is, a mask pattern which is prepared with fidelity to the design pattern, the mask pattern is transferred onto the wafer through an optical system, and an underlayer is etched, whereby it is possible to form the pattern substantially as designed on the wafer. However, as miniaturization of the pattern advances, it becomes difficult to form the pattern with fidelity in each process, and a problem occurs that the final finished size does not satisfy the design pattern. To solve these problems, means (hereinafter referred to as mask design processing) becomes very important which prepares the mask pattern that is different from the design pattern in consideration of a conversion difference between the processes so that the final finished size becomes equal to a design pattern size.

The mask data processing includes a processing method to change the mask pattern by use of graphic data processing, a design rule checker or the like. In recent years, there are optical proximity correction (OPC) processing to correct an optical proximity effect (OPE) and the like. When these types of processing are performed, the mask pattern is appropriately corrected so that the final finished size reaches a desired size.

In recent years, with the miniaturization of a device pattern, a k1 value (k1=W/(NA/λ), wherein W is the dimension of the design pattern, λ is the exposure wavelength of an exposure apparatus and NA is the numerical aperture of a lens for use in the exposure apparatus) in a photolithography process is increasingly reduced. As a result, the OPE tends to be further enhanced, and a load of OPC processing becomes very large. To achieve a high precision of the OPC processing, a mainstream is a model-based OPC technique which is provided with a optical lithography simulator capable of correctly predicting the OPE and which can calculate an appropriate correction value for each mask pattern.

In the model-based OPC, a method is very important which calculates the correction value of the mask pattern to maximize a process margin. The process margin in the lithography includes a focus margin and a dose margin. In a conventional method, under specific conditions, the correction value of the mask pattern has been calculated so that the maximum design margin can be obtained with respect to an allowable size specification of the design pattern. However, with the decrease in the k1 value, it becomes difficult to obtain the predetermined dose margin, if this means is adopted (see, e.g., Jpn. Pat. Appln. KOKAI Publication No. 2001-013668).

Therefore, there has been a demand, not only for a higher precision of the model-based OPC, but also for realization of a design data processing method capable of matching a shape on a wafer with predetermined shape specifications, a program to make the method possible, and a manufacturing method of a semiconductor device by use of a mask based on the design data processing method.

BRIEF SUMMARY OF THE INVENTION

According to a first aspect of the invention, there is provided a design data processing method in a semiconductor device which includes:
  extracting, from design data, a graphic in which there exist a first wiring and a second wiring which is orthogonal to the first wiring; and
  changing a portion where the first wiring is orthogonal to the second wiring to make connection at an angle other than 90 degrees, thereby preparing new design data.

According to a second aspect of the invention, there is provided a computer program for semiconductor device design data processing, which is stored in a computer readable medium, the program including:
  extracting, from design data, a graphic in which there exist a first wiring and a second wiring which is orthogonal to the first wiring; and
  changing a portion where the first wiring is orthogonal to the second wiring to make a connection at an angle other than 90 degrees, thereby preparing new design data.

According to a third aspect of the invention, there is provided a method of manufacturing a semiconductor device, which includes:
  preparing design pattern data;
  processing the design pattern data for mask making, the processing including:
    extracting, from the design pattern data, a graphic in which there exist a first wiring and a second wiring which is orthogonal to the first wiring; and
    changing a portion where the first wiring is orthogonal to the second wiring to make a connection at an angle other than 90 degrees, thereby preparing new design pattern data;
  making masks from the new design pattern data;
  forming predetermined films on a semiconductor wafer, patterning the predetermined films by photolithography by use of the masks, and forming the wirings;
  dicing the semiconductor wafer to form a plurality of chips; and
  mounting each of the plurality of chips on a predetermined package with terminals, to connect the wirings of the chips to the terminals and perform electric inspection.

DETAILED DESCRIPTION OF THE INVENTION

In the following design data processing method in embodiments of the present invention, a computer program includes a step of extracting, from design data, a portion where first and second wirings make square connection (the first wiring is orthogonal to the second wiring), and changing the portion to make connection at an angle other than 90 degrees, thereby preparing new design data. In consequence, a shape on a wafer can be matched with predetermined shape specifications.

Moreover, since a semiconductor device is manufactured using a mask based on such design data, a photolithography margin increases, the original performance of the device is not degraded, and it is possible to manufacture the semiconductor device in a photolithography process with a lower degree of difficulty.

The embodiments of the present invention will be described hereinafter with reference to the drawings.

First Embodiment

Figure 1A:
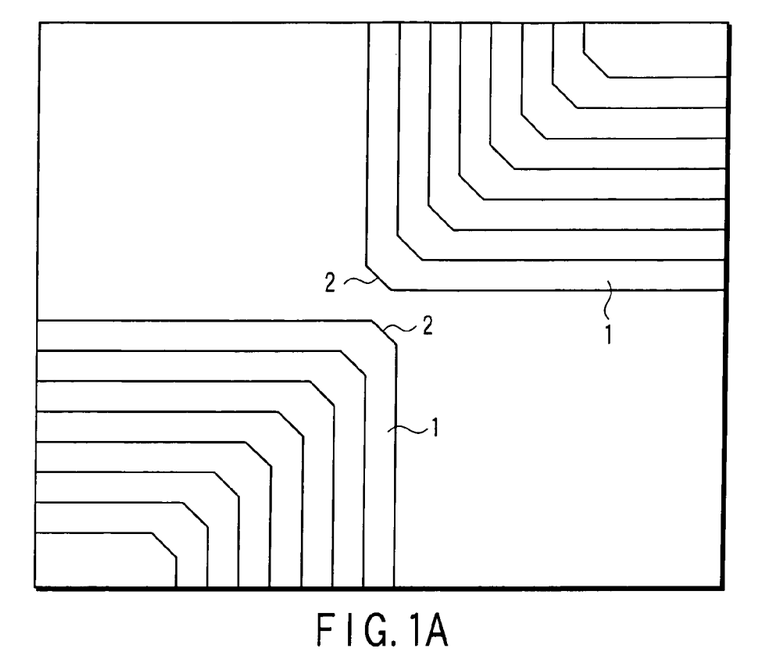
FIG. 1A shows a mask pattern in which a corner cut-off is disposed in a corner portion in a first embodiment of the present invention.
Figure 1B:
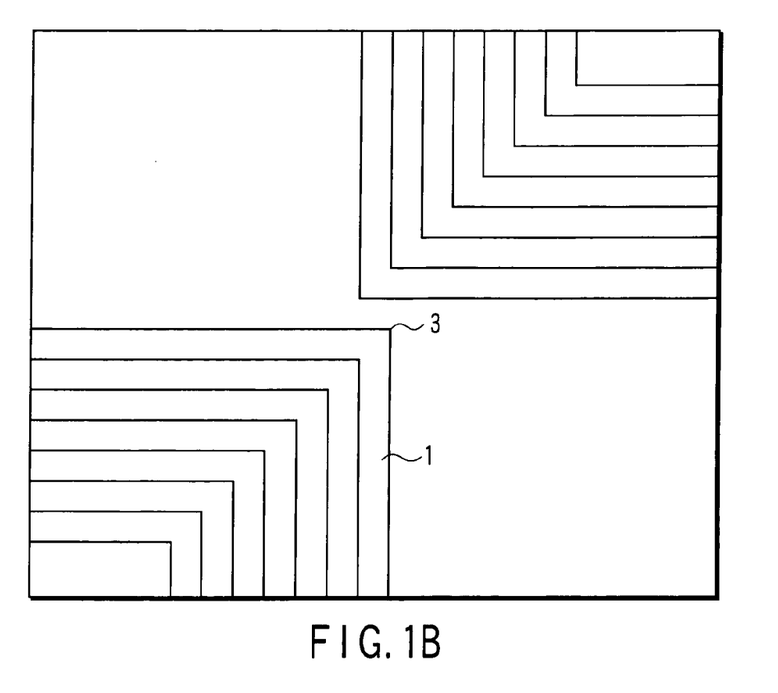
FIG. 1B shows a mask pattern having a right-angled corner portion in a comparative example.

FIG. 1A shows a design pattern prepared (or corrected) in a first embodiment of the present invention, and FIG. 1B shows, as a comparative example, a design pattern before corrected, which has been prepared by a conventional method. That is, a portion bent at right angles in a usual design pattern is worked into a corner cut-off state in the first embodiment. It is to be noted that each of a minimum line width and a minimum space width of this design pattern is designed to be 90 nm.

Figure 2A:
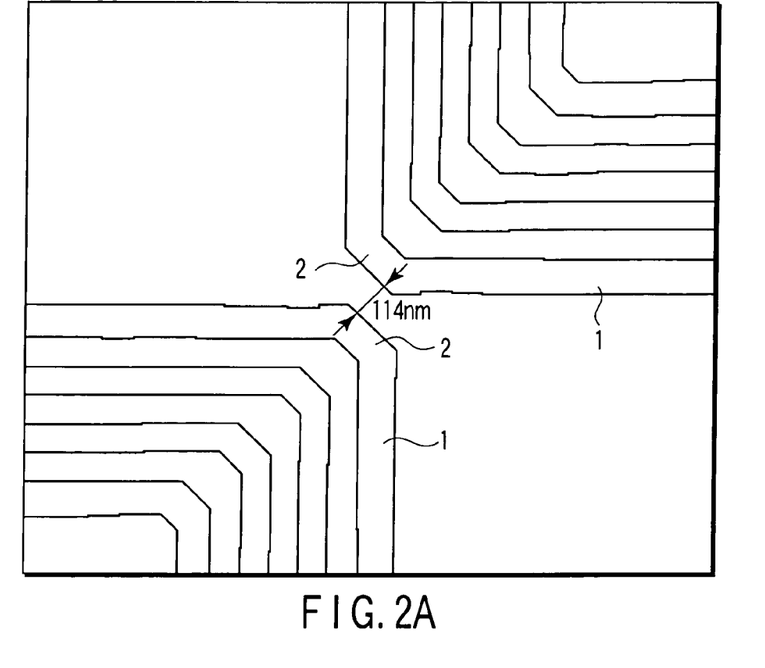
FIG. 2A shows a mask pattern obtained by subjecting FIG. 1A to OPC processing.
Figure 2B:
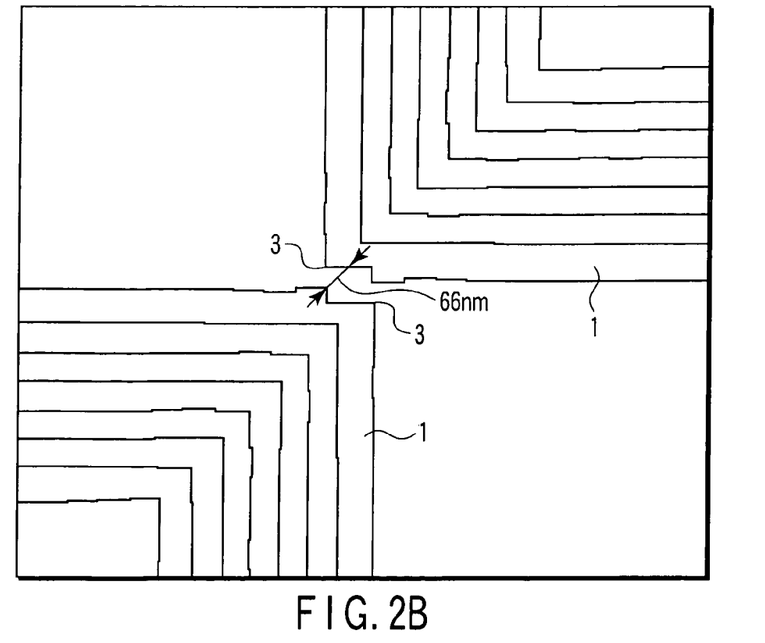
FIG. 2B shows a mask pattern obtained by subjecting FIG. 1B to OPC processing.
Figure 3A:
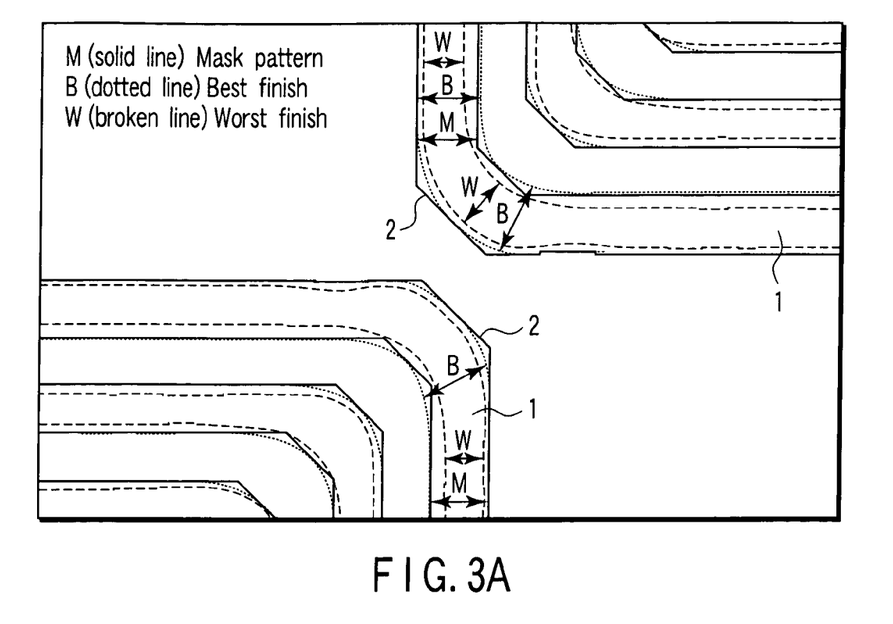
FIG. 3A shows a finished pattern shape on a wafer in a case where the mask pattern of FIG. 2A is used.
Figure 3B:
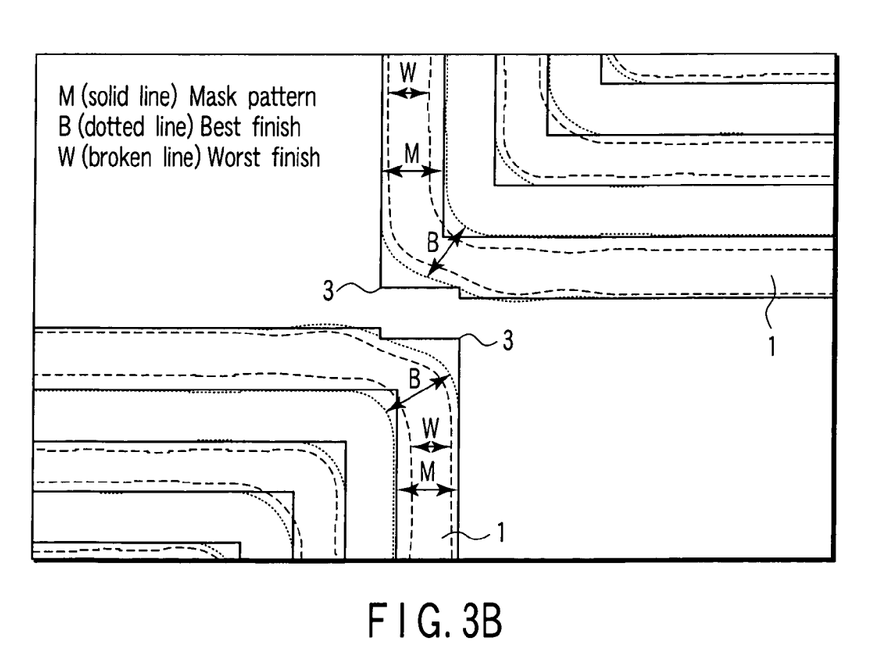
FIG. 3B shows a finished pattern shape on a wafer in a case where the mask pattern of FIG. 2B is used.

Furthermore, FIGS. 2A and 2B show mask patterns obtained by subjecting these patterns to OPC processing, respectively. It is seen that slight concave and convex are formed on linear edges by the OPC processing. Furthermore, FIGS. 3A and 3B show shapes finished on wafers using the mask patterns. It is to be noted that in FIGS. 1 to 3, diagrams provided with suffixes A and B correspond to one another, respectively. In FIGS. 3A and 3B, solid lines M show design mask patterns (corresponding to FIGS. 2A and 2B), dotted lines B show best finishes during finishing, and broken lines W show worst finishes during the finishing.

In a conventional technique, it has been difficult to form, completely at right angles as shown in FIG. 3B, a finished shape of a right angle portion of the design pattern having the minimum linear width and the minimum space width as shown in FIG. 1B. A reason for this is that all of diffracted light from the mask pattern irradiated with illumination of an exposure apparatus cannot strike on a lens of the exposure apparatus, and especially high order diffracted light which largely influences the shape of the corner portion overflows out of the lens.

However, in the OPC processing, a mask pattern shape is determined so that the same shape as that of the design pattern can be formed on the wafer as long as possible. The mask pattern shape is determined so that, for example, the right angle portion can be formed on the wafer as faithfully (with fidelity) as possible. Therefore, in the OPC processing, there is a tendency to extremely correct the shape of the mask pattern. As a result, as shown in FIG. 2B, in a case where the right angle portion comes close to another right angle portion with the minimum space width, a mask pattern size comes close to 66 nm. A short distance between the mask patterns indicates that problems might occur in two respects.

One of the problems is a size precision at a time when a mask is made. When the pattern size is smaller, it becomes difficult to hold the precision. The other problem relates to a precision of inspection of a defect on the mask. In a case where there is, in the mask pattern, a pattern having a size approximately equal to a defect size, a mask defect inspection unit needs to judge whether or not this pattern is a defect. The smaller the pattern is, the more the precision to judge the defect drops. There is a high possibility that this pattern is recognized as a false defect. In a case where there are too many false defects, there is produced an operation of lowering an inspection sensitivity itself or manually sorting out the false defect, and this is a factor for delaying a mask making time.

In the first embodiment, the above problems are considered, the design pattern is prepared in which rounding of the right angle portion in a photolithography process is considered beforehand, and the design pattern is subjected to the OPC processing. Specifically, as shown in FIG. 1A, there is prepared a design pattern in which corners of the right angle portion of the design pattern are cut (corner cut-off) beforehand so that a shape agrees with a plane shape finished on the wafer. In the present embodiment, the right angle portion is cut with a 45-degree oblique line to prepare the design pattern. That is, a design pattern having an arbitrary angle may be used. An object is to prepare the design pattern by use of an arbitrary plane pattern shape so that the shape agrees with the plane shape finished on the wafer.

FIG. 2A shows a result obtained by subjecting, to the OPC processing, the design pattern in which a part of the right angle portion is cut. As seen from comparison between FIGS. 2A and 2B, in FIG. 2A, since the shape of the design pattern is brought close to the plane shape finished on the wafer beforehand, extreme correction is not performed on the mask. As a result, the minimum space width on the mask is increased from 66 nm to 114 nm, and it is possible to avoid the above-described problem generated during mask drawing or defect inspection.

It is to be noted that as described above, FIGS. 3A and 3B show the best finishes (B: dotted lines) and the worst finishes (W: broken lines) of the plane shape finished on the wafer, and the mask patterns (M: solid lines), in a case where an exposure variance, a focus fluctuation and the like of the exposure apparatus are taken into consideration.

A large deviation between the best finish and the worst finish means that the plane shape finished on the wafer easily changes with respect to the exposure variance and the focus fluctuation of the exposure apparatus. When FIG. 3A is compared with FIG. 3B, it can be said that a variance amount of the plane shape with respect to the exposure variance, the focus fluctuation and the like of the exposure apparatus is smaller in FIG. 3A of the first embodiment of the present invention than in FIG. 3B of a conventional method, and a margin with respect to the fluctuation of the exposure apparatus is larger in the first embodiment. It can be confirmed that when the pattern is formed on the wafer by this technique, fluctuation margins can be enhanced with respect to the mask drawing, the defect inspection precision and the exposure apparatus.

It is to be noted that in the first embodiment, the exposure variance and the focus fluctuation of the exposure apparatus have been described, but the process fluctuations are not limited to those of the exposure apparatus, and process fluctuations generated in a general photolithography process are included.

Second Embodiment

Figure 4A:
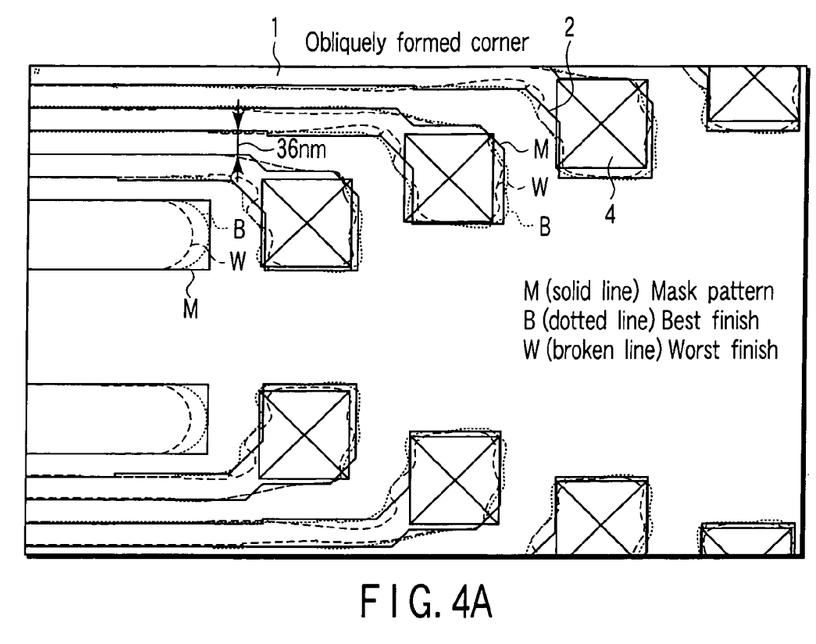
FIG. 4A shows a mask pattern in which an oblique pattern is disposed in a pad connecting portion in a second embodiment of the present invention.
Figure 4B:
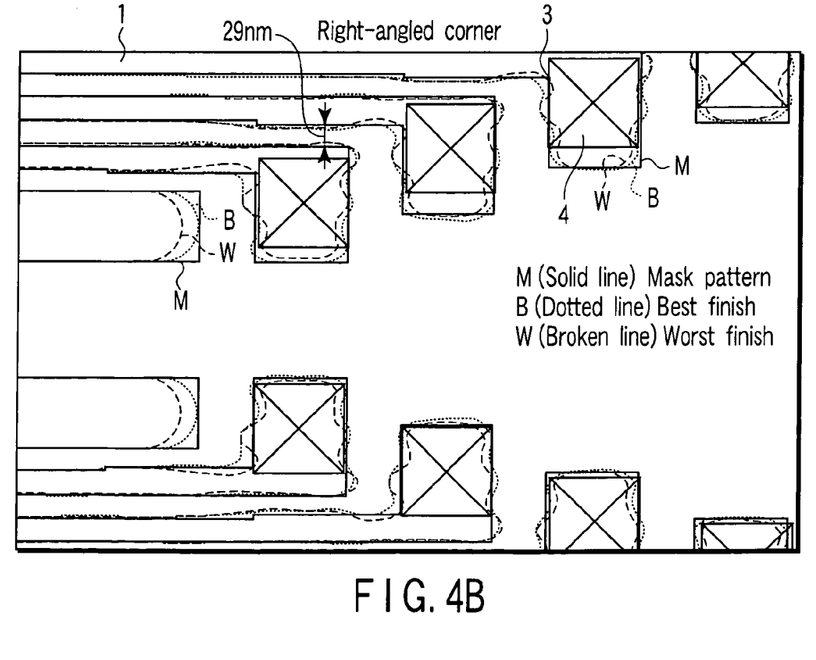
FIG. 4B shows a mask pattern in which a pad connecting portion has a right-angled pattern in the comparative example.

FIGS. 4A and 4B show best finishes (dotted lines) and worst finishes (broken lines) of a plane shape finished on a wafer, and mask patterns (solid lines), in a case where an exposure variance, a focus fluctuation and the like of an exposure apparatus are taken into consideration in a part of a pattern of a drawn portion from a memory cell. FIG. 4A shows a case where an obliquely formed corner 2 is disposed in a portion where a wiring 1 is connected to a pad 4 (second embodiment), and FIG. 4B shows a case where a portion where a wiring 1 is connected to a pad 4 forms a right-angled corner 3 in a comparative example by a conventional method.

In a pattern of this drawn portion, a terminal end of the drawn wiring 1 corresponds to the pad 4, and in this pad 4, there is disposed a pattern (not shown) referred to as a via pattern for connection to another wiring, with the proviso that the via pattern is a layer separate from that of the drawn wiring 1 of FIGS. 4A and 4B.

In the second embodiment (FIG. 4A), the pattern is prepared in which the obliquely formed corner is connected with an oblique line having an angle of approximately 45 degrees, but the line is not limited to the 45-degree oblique line. That is, a pattern having an arbitrary angle may be used.

In a case where process fluctuations are considered, a minimum space width of a finished shape on a wafer in a best finish B in FIG. 4A is compared with that in FIG. 4B. In FIG. 4A of the second embodiment, the width is 36 nm, and in FIG. 4B of the conventional method, the width is 29 nm. It is seen that the minimum space width of the present embodiment is broader than that of the conventional method, and the possibility of short-circuiting is lower in the present embodiment.

Moreover, a large deviation between the best finish B and a worst finish W means that the plane shape finished on the wafer easily changes with respect to the exposure variance and the focus fluctuation of the exposure apparatus. When FIG. 4A is compared with FIG. 4B, it can be said that a variance amount of the plane shape with respect to the exposure variance, the focus fluctuation and the like of the exposure apparatus is smaller in FIG. 4A of the second embodiment than in FIG. 4B of the conventional method, and a margin with respect to the fluctuation of the exposure apparatus is larger in the second embodiment. It can be confirmed that when the pattern is formed on the wafer by this technique, fluctuation margins can be enhanced with respect to mask drawing, defect inspection precision and the exposure apparatus.

Third Embodiment

In a third embodiment, there will be described a method of preparing the design pattern described in the first embodiment. This method of producing this design pattern roughly includes two methods. One method is a method of designing a shape of a corner portion so that the shape agrees with a plane shape finished on a wafer, in order to shorten a peripheral length of the pattern in a routing step during designing. The other method is a method of extracting an only right angle portion, and deforming a shape of a corner portion so that the shape agrees with the plane shape finished on the wafer, in order to shorten the peripheral length of the pattern, in a step of preparing mask data with respect to a design pattern routed at right angles. In the latter method, there is an advantage that the pattern designed by a conventional design technique can easily be subjected to computer processing.

First, there will be described a method of preparing the pattern in the routing step during the designing. In chip design, the designing is performed by a step of first performing placement of individual modules referred to as cells based on circuit information, and routing the cells with each other. This step is referred to as a P&R step, and in this step, wirings to be formed on the wafer are determined.

In the routing step, in many cases, the routing is performed by dividing the design pattern into certain predetermined widths of grids so that each wiring is laid on the grid. For example, in a case where a minimum grid width is set to 90 nm, as shown in FIGS. 5A, 5B and 5C, it is possible to perform the routing with several variations.

Figure 5A:
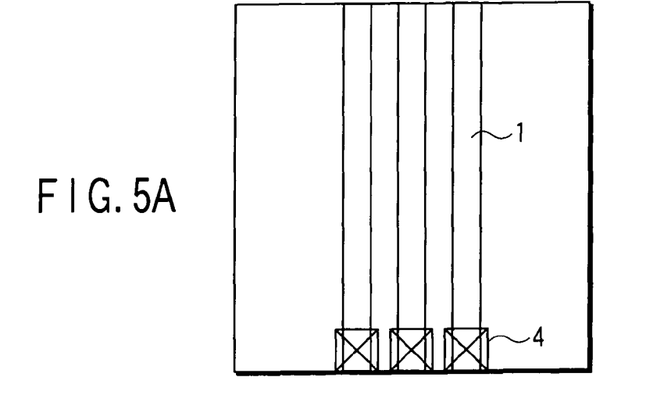
FIGS. 5A to 5C are explanatory views of variations of a wiring pattern in a third embodiment.

FIG. 5A shows a case where wirings 1 are simply linearly formed, and connected to pads 4. This case has an advantage that a wiring length is minimized. On the other hand, a dense wiring shape is obtained. Therefore, a critical area (CA) enlarges. There is a high possibility that the wiring opens or short-circuits in a case where dust generated during manufacturing falls in this dense portion. This becomes a factor for deterioration of yield.

Figure 5B:
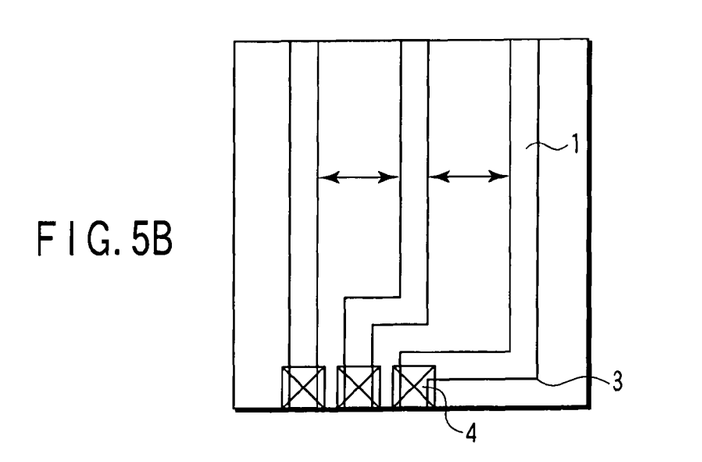

On the other hand, FIG. 5B shows one routing method proposed in order to avoid the yield drop due to the enlargement of the CA, and this method is a technology referred to as wire spreading. In this technology, chip size does not increase, and the routing is intentionally performed so that a dense pattern cannot be formed. As compared with FIG. 5A, the CA is reduced, and the yield drop attributable to the dust can be inhibited. On the other hand, as compared with FIG. 5A, a wiring length extends. Furthermore, a position of the pad 4 to be connected to another wiring referred to as a via wiring is fixed. Therefore, bending of the wiring at right angles and connecting of the wiring to the via wiring are unavoidable. In this manner, right-angled wiring portions 3 are formed which are absolutely necessary for connecting the wiring to the via wiring. Accordingly, there is sometimes a problem of ease of manufacturing by photolithography as described in the first embodiment.

Figure 5C:
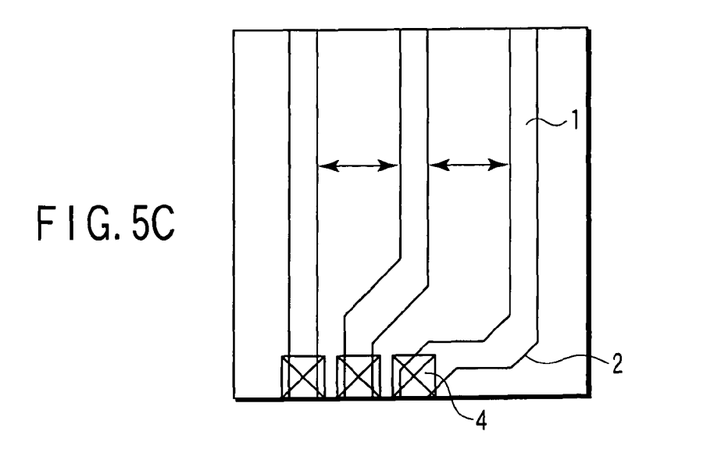

To solve the problem, wirings shown in FIG. 5C are used as the design pattern, whereby the CA can be reduced, and the ease of manufacturing by photolithography can be enhanced. In FIG. 5C, to shorten a pattern peripheral length, in consideration of the plane shape finished on the wafer, each corner portion 2 is cut obliquely at 45 degrees, or added.

Figure 6:
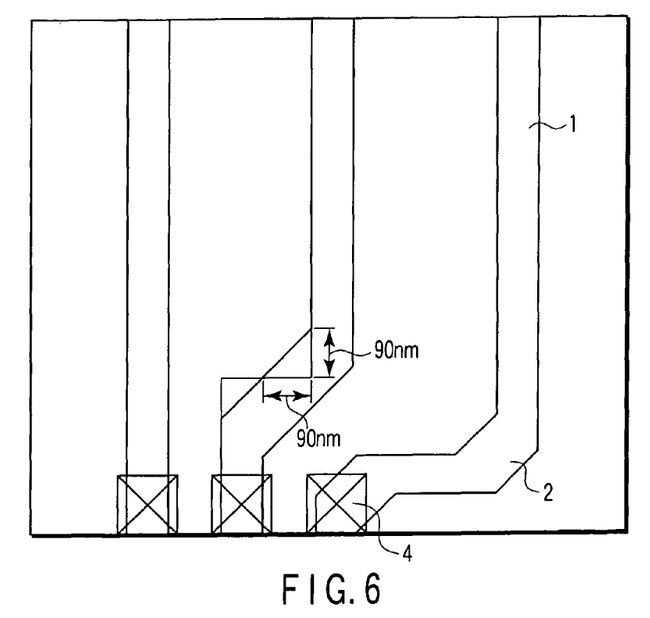
FIG. 6 is an explanatory view of a method of forming an oblique pattern in the third embodiment.

A specific processing method is shown in FIG. 6. In the routing step, the routing is performed to lay each wiring in the predetermined grid width. Therefore, it is very easy to perform the routing so that the corner portion is cut obliquely at 45 degrees. As to, for example, a wiring portion in the center of FIG. 6, when extracting positions of grids before and after a position where vertices intersect each other at right angles, and obliquely connecting one of the positions to the other position, corner portions can be obliquely routed. The position does not have to be limited to that of one grid before or after the vertex position, and the positions of the arbitrary number of grids may be extracted.

In a case where the same number of the grids are selected before and after the position where the vertices intersect each other at right angles, a wiring pattern surely has an angle of 45 degrees. However, in a case where the routing is performed at an arbitrary angle, the same number of the grids do not have to be selected. If there is a via wiring in a right-angled corner portion, an angle of the vertex of the via wiring may be changed in accordance with an angle of the wiring. In this manner, the design pattern can be allowed to easily pass a design rule check.

Furthermore, after such processing is performed, to further enhance the ease of photolithography of the wiring pattern, a width of the wiring pattern may be broadened in accordance with an adjacent space width or pattern width in such a range that does not influence a timing analysis result of a circuit. The present design pattern preparing method includes combining of all of these methods to form the design pattern. The technique of FIG. 6 is, needless to say, applicable to the first and second embodiments.

Figure 10:
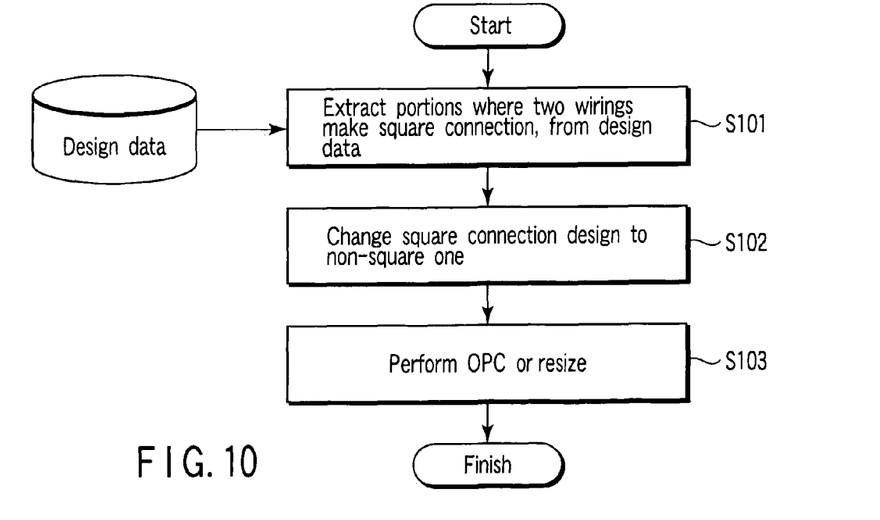
FIG. 10 is a process flow chart of a pattern processing method in the third embodiment.

Next, there will be described a method of applying the present invention at a time when the design pattern is right angled, and mask data is prepared from the design pattern. The method is basically the same as the above method, but the present invention is applied to a pre-stage in which OPC processing is performed in processing the mask data. A basic process flow is shown in FIG. 10. That is, a computer is used, and portions where two wirings make square connection are extracted from design data (S101). Subsequently, square connection design is changed to non-square one (S102). With respect to the design data changed in this manner, OPC or resize is performed.

To be more specific, first an inner right angle portion and an outer right angle portion are separately extracted, respectively. To the inner right angle portion, a triangle is added so that the right angle portion of an isosceles right triangle having a grid width agrees with the inner right angle portion. From the outer right angle portion, a triangle is removed so that the right angle portion of the isosceles right-angle triangle having the grid width agrees with the outer right angle portion. When such processing is performed before the OPC processing, the right angle portion of the design pattern can be formed to be oblique, and it is possible to produce a pattern shape similar to that of FIG. 6 during the preparation of the mask data.

Here, it is meant that similarly the data does not have to be limited to the isosceles right triangle, and the right angle portion of the isosceles right triangle can be prepared with a 45-degree pattern. In a case where an arbitrary angle is allowable, the triangle to be added or deleted may be a right-angled triangle. Furthermore, when this processing is repeated a plurality of times, it is possible to form a wiring pattern which continuously changes to 45 degrees, 30 degrees, and 22.5 degrees.

Figure 7A:
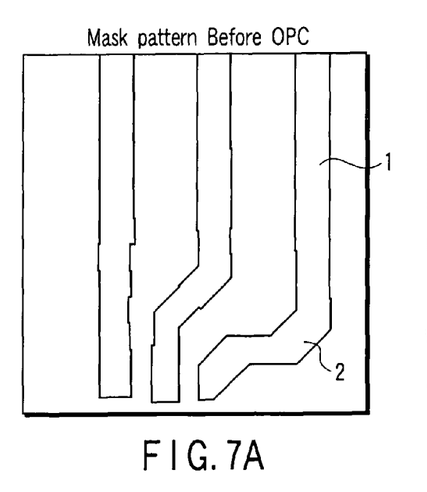
FIG. 7A is a diagram showing a pattern after OPC of the oblique pattern in the third embodiment.
Figure 7B:
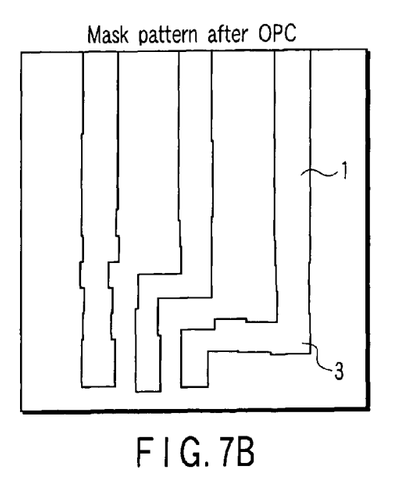
FIG. 7B is a diagram showing a pattern after OPC of the right-angled pattern in the comparative example.
Figure 8A:
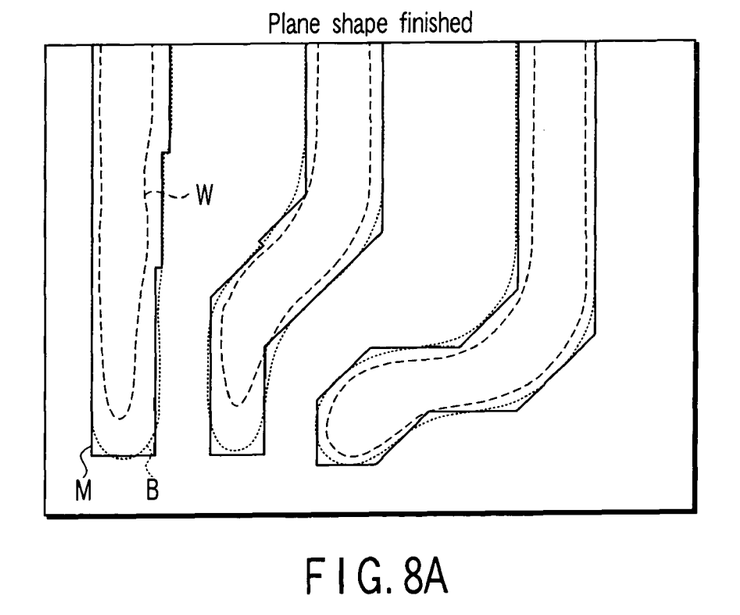
FIG. 8A is a finished pattern diagram of the oblique pattern in the third embodiment.
Figure 8B:
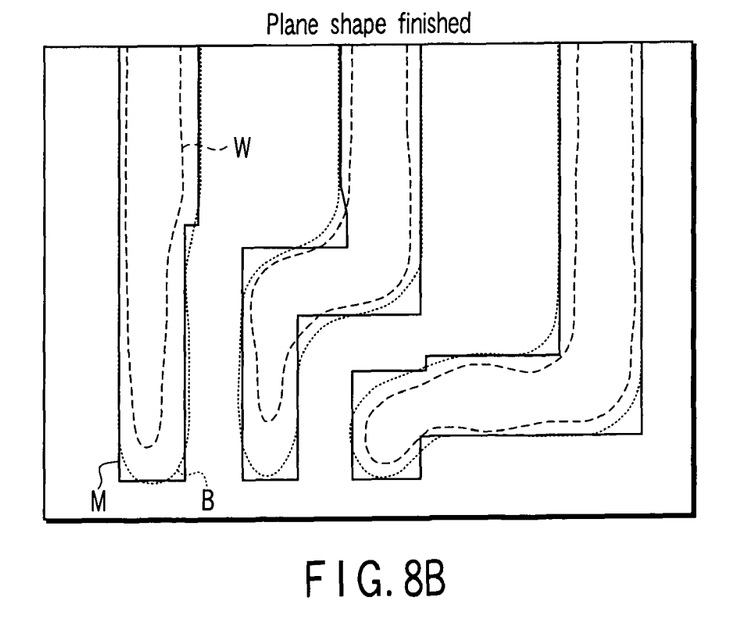
FIG. 8B is a finished pattern diagram of the right-angled pattern in the comparative example.

FIGS. 7A and 7B show results of the OPC processing performed with respect to the pattern prepared by such method, and FIGS. 8A and 8B show plane shapes finished on the wafer subjected to exposure using the mask pattern after the OPC processing. Furthermore, comparison between FIGS. 8A and 8B is shown in FIGS. 9A and 9B.

Figure 9A:
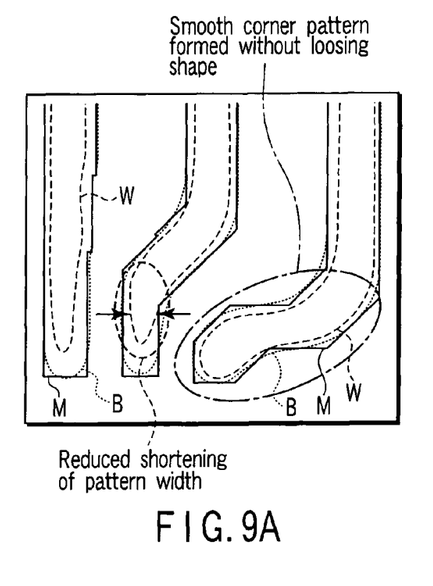
FIG. 9A is a diagram showing an effect of the oblique pattern shown in FIG. 8A in the third embodiment.
Figure 9B:
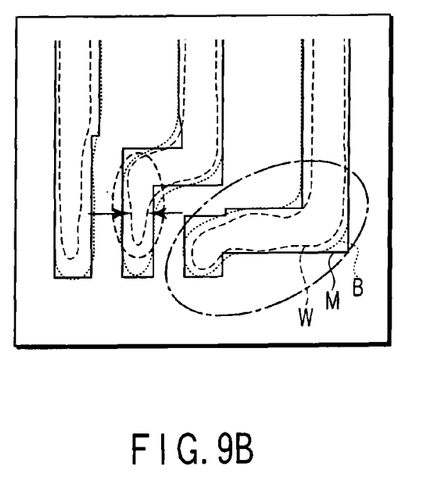
FIG. 9B is a diagram showing an example of the right-angled pattern in the comparative example.

In the present invention, two effects can be confirmed from FIGS. 9A and 9B. A first effect is that shortening of a line size in a line distant end is reduced, and connection to the via wiring is satisfactory. A second effect is that the right angle portion is rounded to thereby enhance a photolithography margin in the corner portion. In a case where a wiring length forming the right angle portion is only one grid, it is difficult to round the right angle portion by the above technique, but such a right angle portion may be judged to be other than an object of round processing.

Figure 11:
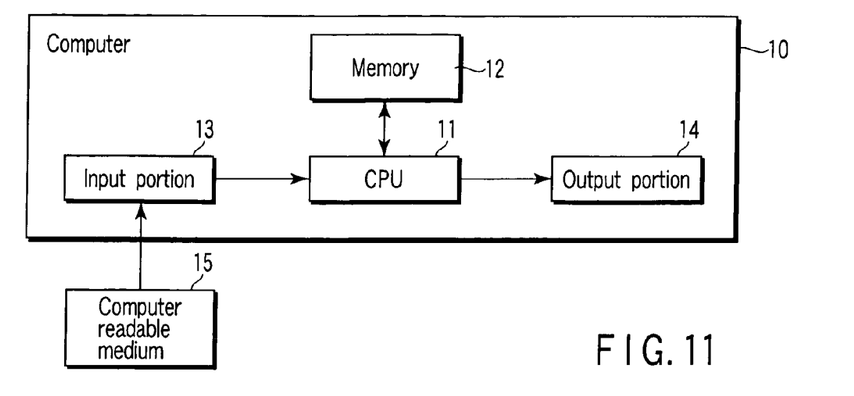
FIG. 11 is a system diagram in a case where the pattern processing method of the present invention is executed using a computer.

It is to be noted that the technique described in the above embodiment can be executed by a computer system 10 shown in FIG. 11. The computer system 10 includes a CPU 11, a memory 12, and input and output portions 13, 14. The above procedure is written as a program into a computer readable medium 15 which is, for example, a magnetic disk, an optical disk such as a CD, DVD or MO, a semiconductor memory or the like, and read by the computer system. Such a computer system may be incorporated into any type of unit, or transmitted by a communication medium to be applied to any type of unit.

Figure 12:
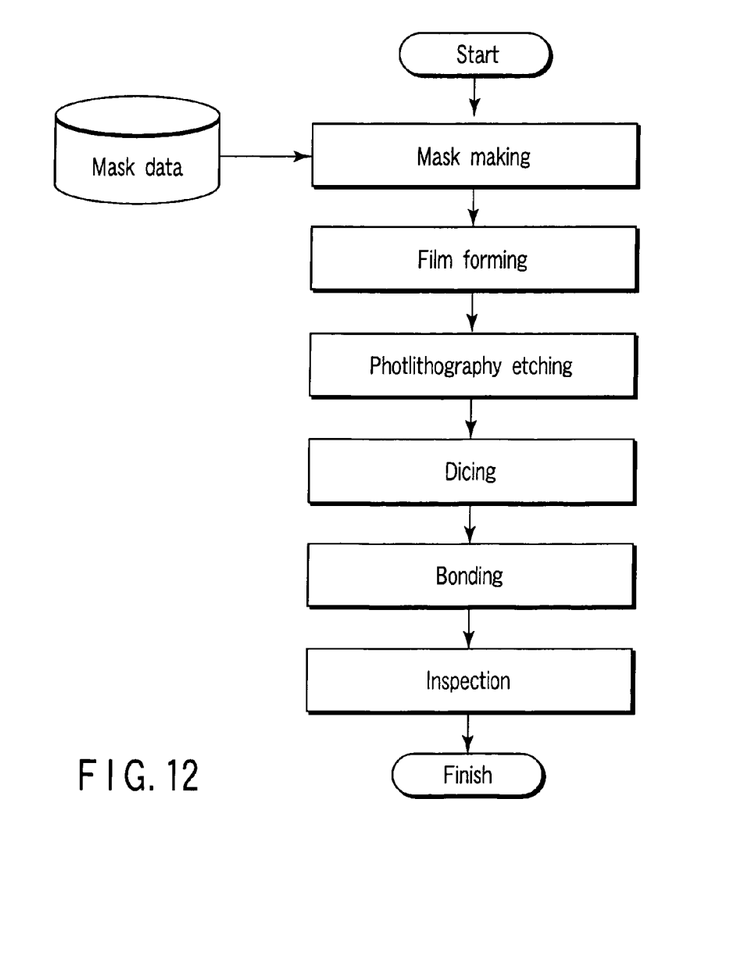
FIG. 12 is a flowchart showing a manufacturing method of a semiconductor device based on mask data prepared using the pattern processing method of the present invention.

Moreover, a semiconductor device can be manufactured using mask data obtained in accordance with a flow chart of FIG. 10. That is, as shown in a flow chart of FIG. 12, a mask is made, a predetermined film is formed on a semiconductor wafer, and patterning is performed by photolithography etching. After repeating this step as needed, dicing is performed to separate the film into a plurality of chips. Each chip is die-bonded to a predetermined package, and a terminal of the package is bonded to a wiring (pad) on the chip to thereby manufacture the semiconductor device.

As described above, according to the design data processing method of the present invention, the plane shape finished on the wafer can be matched with predetermined shape specifications. When the program of the design data processing method is used, it is possible to manufacture the semiconductor device which satisfies predetermined specifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented design data processing method in a semiconductor device comprising the steps, performed by a computer, of:

extracting, from design data, a graphic in which there exist, on the same plane, a first wiring and a second wiring which is directly connected to the first wiring to form right angles at first corners of a first connected portion, the first wiring and the second wiring being formed on the same plane in the semiconductor device; and changing the first corners to have first obliquely connected lines at an angle other than 90 degrees with respect to the first wiring line and the second wiring line on the same plane, thereby preparing new design data, wherein said changing the first corners to have first obliquely connected lines includes:

extracting an inner right angle portion and an outer right angle portion, adding, to the inner right angle portion, an isosceles right triangle having one grid length as one side, deleting, from the outer right angle portion, the isosceles right triangle having the one grid length as the one side, and performing optical proximity correction.

2. The computer-implemented design data processing method according to claim 1, wherein said changing the first corners to have first obliquely connected lines includes making each of the first obliquely connected lines to have a 45-degree angle with respect to the first wiring and the second wiring.

3. The computer-implemented design data processing method according to claim 2, wherein said making each of the first obliquely connected lines to have a 45-degree angle includes:

extracting positions which are apart from each other as much as one grid from the respective first corners; and connecting one of the positions to the other of the positions.

4. The computer-implemented design data processing method according to claim 1, further comprising, after said adding and said deleting the isosceles right triangle, performing resize processing.

5. The computer-implemented design data processing method according to claim 1, wherein said extracting from design data includes extracting a graphic in which there further exists, on the same plane, a third wiring directly connected to the second wiring on the same plane to form right angles at second corners of a second connected portion, and said preparing new design data includes changing the second corners to have second obliquely connected lines.

6. The computer-implemented design data processing method according to claim 5, wherein said changing the second corners to have second obliquely connected lines includes making each of the second obliquely connected lines to have an angle of 45 degrees.

7. The computer-implemented design data processing method according to claim 6, wherein said making each of the second obliquely connected lines to have an angle of 45 degrees includes:

extracting positions which are apart from each other as much as one grid from the respective second corners; and connecting one of the positions to the other of the positions.

8. The computer-implemented design data processing method according to claim 5, wherein said changing the second corners to have second obliquely connected lines includes:

extracting an inner right angle portion and an outer right angle portion;

adding, to the inner right angle portion, an isosceles right triangle having one grid length as one side; and deleting, from the outer right angle portion, the isosceles right triangle having the one grid length as the one side.

9. The computer-implemented design data processing method according to claim 8, further comprising, after said adding and said deleting the isosceles right triangle, performing optical proximity correction.

10. The computer-implemented design data processing method according to claim 8, further comprising, after said adding and said deleting the isosceles right triangle, performing resize processing.

11. A non-transitory computer-readable medium comprising instructions which, when executed on a processor, perform a method for semiconductor device design data processing, the method comprising the steps, performed by a computer, of:

extracting, from design data, a graphic in which there exist, on the same plane, a first wiring and a second wiring which is directly connected to the first wiring to form right angles at corners of a connected portion, the first wiring and the second wiring being formed on the same plane in the semiconductor device; and changing the corners to have obliquely connected lines at an angle other than 90 degrees with respect to the first wiring line and the second wiring line on the same plane, thereby preparing new design data, wherein said changing the corners to have obliquely connected lines includes:

extracting an inner right angle portion and an outer right angle portion, adding, to the inner right angle portion, an isosceles right triangle having one grid length as one side, deleting, from the outer right angle portion, the isosceles right triangle having the one grid length as the one side, and performing optical proximity correction.

12. The method according to claim 11, wherein changing the first corners to have obliquely connected lines includes making each of the obliquely connected lines to have a 45-degree angle with respect to the first wiring and the second wiring.

13. The method according to claim 11, wherein said making each of the obliquely connected lines to have a 45-degree angle includes:

extracting positions which are apart from each other as much as one grid from the respective corners; and connecting one of the positions to the other of the positions.

14. A computer-implemented method of manufacturing a semiconductor device comprising the steps, performed by a computer, of:

preparing design pattern data;

processing the design pattern data for mask making, the processing including:

extracting, from design data, a graphic in which there exist, on the same plane, a first wiring and a second wiring which is directly connected to the first wiring to form right angles at corners of a connected portion, the first wiring and the second wiring being formed on the same plane in the semiconductor device; and changing the corners to have obliquely connected lines at an angle other than 90 degrees with respect to the first wiring line and the second wiring line on the same plane, thereby preparing new design data;

preparing masks based on the new design pattern data; and forming predetermined films on a semiconductor wafer, patterning the predetermined films by photolithography by use of the masks, and forming the wirings, wherein said changing the corners to have obliquely connected lines includes:
extracting an inner right angle portion and an outer right angle portion,
adding, to the inner right angle portion, an isosceles right triangle having one grid length as one side,
deleting, from the outer right angle portion, the isosceles right triangle having the one grid length as the one side, and
performing optical proximity correction.

15. The computer-implemented method according to claim 14, wherein said changing the corners to have obliquely connected lines includes making each of the obliquely connected lines to have a 45-degree angle with respect to the first wiring and the second wiring.

16. The computer-implemented method according to claim 15, wherein said making each of the obliquely connected lines to have a 45-degree angle includes:
extracting positions which are apart from each other as much as one grid from the respective corners; and
connecting one of the positions to the other of the positions.

* * * * *